: US 10,302,679 B2

United States Patent
Bertelsen et al.

(10) Patent No.: US 10,302,679 B2
(45) Date of Patent: May 28, 2019

(54) LIGHTNING MEASURING SYSTEM FOR A WIND TURBINE

(71) Applicant: Global Lightning Protection Services A/S, Herning (DK)

(72) Inventors: Kim Bertelsen, Ulfborg (DK); Thomas Holm Krogh, Klovborg (DK); Søren Find Madsen, Hvalsø (DK)

(73) Assignee: GLOBAL LIGHTNING PROTECTION SERVICES A/S, Herning (DK)

( * ) Notice: Subject to any disclaimer, the term of this patent is extended or adjusted under 35 U.S.C. 154(b) by 0 days.

(21) Appl. No.: 15/123,929

(22) PCT Filed: Mar. 6, 2014

(86) PCT No.: PCT/DK2014/050048
§ 371 (c)(1),
(2) Date: Sep. 6, 2016

(87) PCT Pub. No.: WO2015/131900
PCT Pub. Date: Sep. 11, 2015

(65) Prior Publication Data
US 2017/0176500 A1      Jun. 22, 2017

(51) Int. Cl.
*G01R 15/14*      (2006.01)
*G01R 31/28*      (2006.01)
(Continued)

(52) U.S. Cl.
CPC .......... *G01R 15/14* (2013.01); *F03D 80/30* (2016.05); *G01R 15/181* (2013.01);
(Continued)

(58) Field of Classification Search
CPC .. G01R 15/14; G01R 31/2827; G01R 15/181; G01R 19/00; F03D 11/00
See application file for complete search history.

(56) References Cited

U.S. PATENT DOCUMENTS

2009/0237272 A1* 9/2009 Georgeson ............ B64D 45/02
340/945

2011/0142643 A1     6/2011 Hardison
(Continued)

FOREIGN PATENT DOCUMENTS

EP      0440865 A1      8/1991
EP      2051084 A1      4/2009
(Continued)

OTHER PUBLICATIONS

International Search Report for corresponding application PCT/DK2014/050048 filed Mar. 6, 2014; dated Nov. 14, 2014.
Japanese Office Action for corresponding application 2016-572886; dated Dec. 19, 2017.

*Primary Examiner* — Huy Q Phan
*Assistant Examiner* — Zannatul Ferdous
(74) *Attorney, Agent, or Firm* — Cantor Colburn LLP

(57) ABSTRACT

A lightning measuring system (LMS) for measuring lightning current parameters in a down conductor (DC) in a wind turbine is disclosed, said lightning measuring system (LMS) comprising—a sensor arrangement (SEA) being arranged to measure on said down conductor (DC), —a data collection unit (DCU), —a connection arrangement (CA) electrically connecting said sensor arrangement (SEA) with said data collection unit (DCU), and—an insulating arrangement (INS), wherein said sensor arrangement (SEA) and at least a part of said connection arrangement (CA) and/or said down conductor (DC) being enclosed in said insulating arrangement (INS) thereby defining—a minimum insulation distance (MID) between said sensor arrangement (SEA) and said down conductor (DC), and—a minimum surface distance (MSD) between an exposed part of said down conductor (DC) not being enclosed by said insulating arrangement (INS) and an exposed part of said connection arrangement (CA) not being enclosed by said insulating arrangement (INS), for which said insulating arrangement (INS) is effective to prevent insulation breakdown between said down conductor (DC) and said sensor arrangement (SEA) and to prevent surface flashover between said exposed part of said down conductor (DC) and said exposed part of said connection arrangement (CA).

19 Claims, 9 Drawing Sheets

Figure 1A:
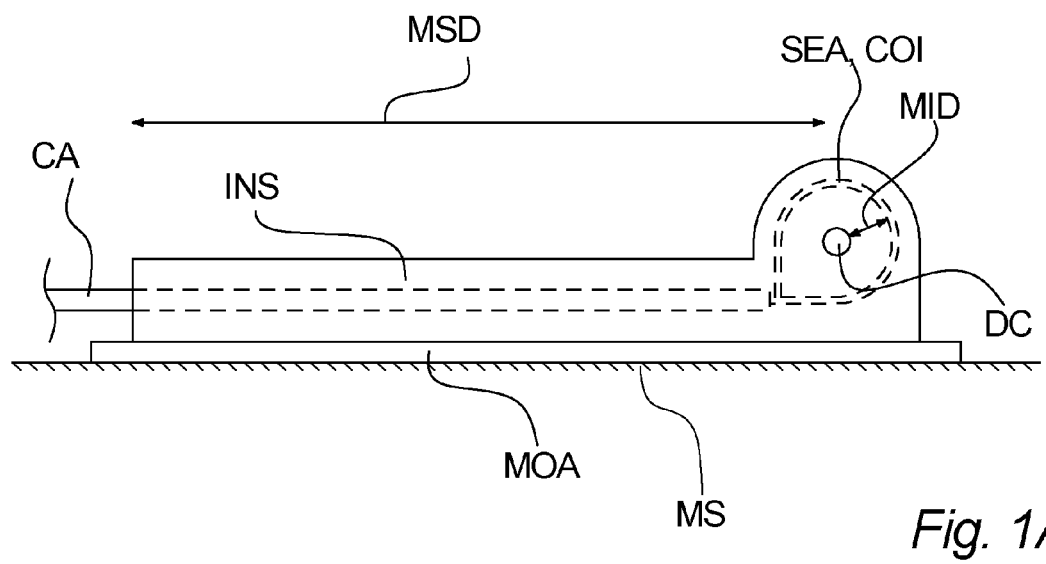

(51) Int. Cl.
  *G01R 15/18*     (2006.01)
  *F03D 80/30*     (2016.01)
  *G01R 29/08*     (2006.01)

(52) U.S. Cl.
  CPC ...... *G01R 31/2827* (2013.01); *G01R 29/0842* (2013.01); *Y02E 10/721* (2013.01)

(56) References Cited

U.S. PATENT DOCUMENTS

| | | | |
|---|---|---|---|
| 2011/0267027 A1* | 11/2011 | Iannotti | G01R 29/0842 324/72 |
| 2012/0025804 A1 | 2/2012 | Brnada | |
| 2012/0029853 A1 | 2/2012 | Baumheinrich | |
| 2012/0133146 A1 | 5/2012 | Naka | |
| 2013/0028739 A1* | 1/2013 | Erichsen | F03D 80/30 416/146 R |
| 2013/0149154 A1 | 6/2013 | Kuroiwa | |

FOREIGN PATENT DOCUMENTS

| | | |
|---|---|---|
| EP | 2551517 A2 | 1/2013 |
| JP | 55147726 U1 | 10/1980 |
| JP | 57117218 A | 7/1982 |
| JP | 2010043936 | 2/2010 |
| WO | 2009083006 A1 | 7/2009 |
| WO | 2010136151 A2 | 12/2010 |
| WO | 2014024303 A1 | 2/2014 |

\* cited by examiner

LIGHTNING MEASURING SYSTEM FOR A WIND TURBINE

FIELD OF THE INVENTION

The invention relates to a lightning measuring system for measuring lightning current parameters in a down conductor in a wind turbine according to claim 1.

BACKGROUND OF THE INVENTION

Different lightning measuring systems are known in the art.

However, there may be practical problems associated with installation of such lightning measuring systems in operating wind turbines.

BRIEF DESCRIPTION

The invention relates in a first aspect to a lightning measuring system for measuring lightning current parameters in a down conductor in a wind turbine, said lightning measuring system comprising
- a sensor arrangement being arranged to measure on said down conductor,
- a data collection unit,
- a connection arrangement electrically connecting said sensor arrangement with said data collection unit, and
- an insulating arrangement, wherein said sensor arrangement and at least a part of said connection arrangement and/or said down conductor being enclosed in said insulating arrangement thereby defining
- a minimum insulation distance between said sensor arrangement and said down conductor, and
- a minimum surface distance between an exposed part of said down conductor not being enclosed by said insulating arrangement and an exposed part of said connection arrangement not being enclosed by said insulating arrangement, for which said insulating arrangement is effective to prevent insulation breakdown between said down conductor and said sensor arrangement and to prevent surface flashover between said exposed part of said down conductor and said exposed part of said connection arrangement.

It may be an object of the invention to solve problems associated with known lightning measuring systems.

One advantage of the invention may be that galvanic separation between the down conductor and the data collection unit is achieved.

One advantage of the invention may be that galvanic separation between the down conductor and the data collection unit is achieved without applying special measurement techniques. I.e. even for relatively conventional measurement techniques, having proven performance, the galvanic separation may be established.

One advantage of the invention may be that by establishing said minimum surface distance and at the same time said minimum insulation distance the data collection unit may be kept safe from lightning strike currents. Thereby, the performance and lifetime of the data collection unit may increase substantially, especially when it is installed in wind turbines in regions where lightning strikes are frequent. Since the insulating arrangement prevents that voltages associated with the lightning current flowing in the down conductor punctures through the insulating arrangement from the down conductor and into the sensor arrangement due to the established minimum insulation distance, and since the insulating arrangement prevents that voltages associated with the lightning current flowing in the down conductor creates a surface flashover on the surface of the insulating arrangement from the down conductor and onto the connection arrangement due to the established minimum surface distance, the data collection unit is kept effectively insulated from the down conductor, and from the extreme voltages and/or currents in the down conductor. I.e. by establishing an effective galvanic insulation between the down conductor and the data collection unit by means of the insulating arrangement, the data collection unit is kept safe from the dangerous effects of the lightning current flown in the down conductor on which it measures and the wind turbine can operate with necessary lightning monitoring even in areas with high lightning strike occurrences.

One problem associated with lightning measuring systems may be that by measuring on the down conductor exhibiting the extreme voltages and/or currents due to the lightning exposure, the lightning measuring system itself may be relatively exposed to these voltages and/currents and may therefore have a relatively short expected lifetime, e.g. down to the first lightning strike. This is constitutes a problem, as later lightning strikes may then not be measured and that the wind turbine cannot be monitored for lightning damage. Even minor lightning damage to a wind turbine, e.g. a wind turbine blade, can develop into fatal turbine damage if not actively counteracted. Therefore, if the lightning measuring system of a wind turbine is damaged and unable to monitor the wind turbine, any lightning damage may be unknown, and may therefore develop unhindered. Furthermore, such lightning measuring systems may be relatively expensive to replace.

One advantage of the invention may be that the above problem may be solved.

One advantage of the invention may be that the sensor arrangement, the connection arrangement, and the data collection unit is protected against lightning and can record data for additional lightning strikes to the wind turbine without being damaged by the lightning strikes.

It is important in relation to the invention to understand that even if a sensor arrangement is properly insulated to prevent insulation breakdown, it may often still be vulnerable to surface flashovers. In fact the present inventors have realized that in fact it may be relatively complicated to secure such installations against surface flashovers since a relatively short distance of insulating material may be effective to prevent insulation breakdown in a given setup, whereas a much longer surface distance is needed to prevent surface flashovers.

According to an embodiment of the invention, it should be understood that said lightning measuring system may be installed and be a part of a wind turbine, or at least adapted to be installed in a wind turbine, i.e. the lightning measuring system is adapted for measuring lightning current parameters in a down conductor of a wind turbine.

Furthermore, according to an embodiment, it should be understood that said sensor arrangement is adapted to be arranged to measure on said down conductor.

Finally, according to an embodiment, it should be understood that said insulating arrangement is adapted to enclose said sensor arrangement and to enclose at least a part of said connection arrangement and/or at least part of said down conductor being enclosed in said insulating arrangement. Therefore, said insulating arrangement is effective to prevent, when installed in said wind turbine, insulation breakdown between said down conductor and said sensor arrangement and to prevent, when installed in said win turbine, surface flashover between said exposed part of said down conductor and said exposed part of said connection arrangement.

According to an advantageous embodiment of the invention, said insulating arrangement is effective to prevent insulation breakdown between said down conductor and said sensor arrangement and to prevent surface flashover between said exposed part of said down conductor and said exposed part of said connection arrangement for electric potential differences up to a minimum insulation breakdown voltage and/or a minimum surface flashover voltage, said minimum insulation breakdown voltage and/or said minimum surface flashover voltage being 50 kV, preferably 75 kV, more preferably 100 kV, even more preferably 120 kV, most preferably 140 kV, such as 160 kV, such as 180 kV, such as 200 kV.

In connection to the above embodiment, it is important to understand that the total path of a the electric discharge for a discharge between the exposed part of said down conductor and the exposed part of said connection arrangement may be made up from contributions along a surface and through material. Furthermore, it is important to understand that an infinite number of such combined distances or paths exist. For each of such combined distances, a certain electric potential difference between the exposed part of said down conductor on one hand and the exposed part of said connection arrangement or said sensor arrangement on the other hand is necessary to cause a surface flashover and/or insulation breakdown. Such an electric potential difference is referred to as a minimum surface flashover voltage and a minimum insulation breakdown voltage, respectively. Therefore, if the lowest of the minimum surface flashover voltage, and the minimum insulation breakdown voltage is e.g. 50 kV, an electric potential difference between the sensor arrangement or the connection arrangement on one side and the down conductor on the other side would have to be at least 50 kV to cause any flashover and/or insulation breakdown, and, consequently, the insulating arrangement is effective to prevent any flashover and/or insulation breakdown of electric potential differences up to at least 50 kV.

One advantage of the above embodiment may be that the sensor arrangement, the connection arrangement, and the data collection unit is protected against lightning and can record data for additional lightning strikes to the wind turbine without being damaged by the lightning strikes.

According to an advantageous embodiment of the invention, said insulating arrangement is arranged so as to fulfil the condition given by $$\min\left[\sum_{i,j} (D_{mat,i} \cdot E_{mat} + D_{sur,j} \cdot E_{sur})\right] \geq C_{\mathit{eff}}$$

wherein $D_{mat,i}$ represents the i'th distance element through said insulating arrangement, $D_{sur,j}$ represents the j'th distance element on a surface, e.g. of said insulating arrangement, wherein $E_{mat}$ represents the electric field needed to cause an insulation breakdown, $E_{sur}$ represents the electric field needed to cause a surface flashover, and wherein $C_{\mathit{eff}}$ is 50 kV, preferably 75 kV, more preferably 100 kV, even more preferably 120 kV, most preferably 140 kV, such as 160 kV, such as 180 kV, such as 200 kV.

The above embodiment signifies that the minimum failure voltage being the sum of the electric field strengths needed to cause flashover and/or insulation breakdown along any possible path is at least 50 kV, such as 75 kV, such as 100 kV, such as 120 kV, such as 140 kV, such as 160 kV, such as 180 kV, such as 200 kV. In this respect the minimum failure voltage can be understood as the lowest of the minimum surface flashover voltage, insulation breakdown voltage, and any effective voltage for combination paths along surface(s) and through the insulating arrangement.

Therefore, according to the above embodiment, the insulating arrangement is adapted to prevent, due to the established minimum surface distance and minimum insulation distance, any surface flashover, insulation breakdown, or combination thereof, for up to the failure voltage.

One significant advantage of the above embodiment may be that the lightning measuring system is unharmed by lightning current in the down conductor, at least for the specified voltages. Due to the protection facilitated by the insulating arrangement, a surface flashover and/or an insulation breakdown will have to cross an effective barrier, which requires electric potential difference of at least the failure voltage, between said down conductor on one hand and said connection arrangement or sensor arrangement on the other hand before an electric discharge will take place. Thereby, the data collection unit may be allowed to be in direct electrical contact with the sensor arrangement throughout the duration of several additional lightning strikes conducted by the down conductor.

One advantage of the above embodiment may be that the sensor arrangement, the connection arrangement, and the data collection unit is protected against lightning and can record data for additional lightning strikes to the wind turbine without being damaged by the lightning strikes.

According to an advantageous embodiment of the invention, said insulating arrangement is arranged so as to fulfil the condition given by $$\min\left[\sum_{i,j,k} (D_{mat,i} \cdot E_{mat} + D_{sur,j} \cdot E_{sur} + D_{air,k} \cdot E_{air})\right] \geq C_{\mathit{eff}}$$

wherein $D_{mat,i}$ represents the i'th distance element through said insulating arrangement (INS), $D_{sur,j}$ represents the j'th distance element on a surface, e.g. of said insulating arrangement, $D_{air,k}$ represents the k'th distance element through air, wherein $E_{mat}$ represents the electric field needed to cause an insulation breakdown, $E_{sur}$ represents the electric field needed to cause a surface flashover, $E_{air}$ represents the electric field needed to cause an air flashover, and wherein $C_{\mathit{eff}}$ is 50 kV, preferably 75 kV, more preferably 100 kV, even more preferably 120 kV, even more preferably 140 kV, such as 160 kV, such as 180 kV, such as 200 kV.

The above embodiment signifies that the minimum failure voltage being the sum of the electric field strengths needed to cause flashover and/or insulation breakdown along any possible path is at least 50 kV, such as 75 kV, such as 100 kV, such as 120 kV, such as 140 kV, such as 160 kV, such as 180 kV, such as 200 kV. In this respect the minimum failure voltage can be understood as the lowest of the minimum surface flashover voltage, minimum air flashover voltage, insulation breakdown voltage, and any effective voltage for combination paths along surface(s), through air, and through the insulating arrangement. Therefore, according to the above embodiment, the insulating arrangement is adapted to prevent, due to established minimum surface distance, minimum insulation distance, and minimum air distance, any surface flashover, air flashover, insulation breakdown, or combination thereof, for up to the failure voltage.

One advantage of the above embodiment may be that the sensor arrangement, the connection arrangement, and the data collection unit is protected against lightning and can record data for additional lightning strikes to the wind turbine without being damaged by the lightning strikes.

According to an advantageous embodiment of the invention, said minimum insulation distance is effective to prevent insulation breakdown for electric potential differences between said down conductor and said sensor arrangement of up to 50 kV, preferably up to 75 kV, more preferably up to 100 kV, even more preferably up to 120 kV, most preferably up to 140 kV, such as up to 160 kV, such as up to 180 kV, such as up to 200 kV.

One advantage of the above embodiment may be that the sensor arrangement, the connection arrangement, and the data collection unit is protected against lightning and can record data for additional lightning strikes to the wind turbine without being damaged by the lightning strikes, and especially against insulation breakdown.

According to an advantageous embodiment of the invention, said minimum surface distance is effective to prevent surface flashover for electric potential differences between said down conductor and said sensor arrangement of up to at least 50 kV, preferably up to 75 kV, more preferably up to 100 kV, even more preferably up to 120 kV, most preferably up to 140 kV, such as up to 160 kV, such as up to 180 kV, such as up to 200 kV.

One advantage of the above embodiment may be that the sensor arrangement, the connection arrangement, and the data collection unit is protected against lightning and can record data for additional lightning strikes to the wind turbine without being damaged by the lightning strikes, and especially against surface flashover.

According to an advantageous embodiment of the invention, said sensor arrangement and at least a part of said connection arrangement and/or said down conductor being enclosed in said insulating arrangement thereby further defining a minimum air distance between an exposed part of said down conductor not being enclosed by said insulating arrangement and an exposed part of said connection arrangement not being enclosed by said insulating arrangement.

One advantage of the above embodiment may be that the sensor arrangement, the connection arrangement, and the data collection unit is protected against lightning and can record data for additional lightning strikes to the wind turbine without being damaged by the lightning strikes, and especially against air flashover.

According to an advantageous embodiment of the invention, said minimum air distance is effective to prevent air flashover for electric potential differences between said down conductor and said connection arrangement of up to at least 50 kV, preferably up to 75 kV, more preferably up to 100 kV, even more preferably up to 120 kV, most preferably up to 140 kV, such as up to 160 kV, such as up to 180 kV, such as up to 200 kV.

One advantage of the above embodiment may be that the sensor arrangement, the connection arrangement, and the data collection unit is protected against lightning and can record data for additional lightning strikes to the wind turbine without being damaged by the lightning strikes, and especially against air flashover.

According to an advantageous embodiment of the invention, said minimum surface distance is at least 30 cm, preferably at least 50 cm, more preferably at least 70 cm, even more preferably at least 80 cm, most preferably at least 90 cm, such as at least 100 cm, such as at least 125 cm, such as at least 150 cm.

According to an advantageous embodiment of the invention, said minimum insulation distance is at least 5 mm, preferably at least 8 mm, more preferably at least 10 mm, even more preferably at least 12 mm, most preferably at least 14 mm, such as at least 16 mm, such as at least 18 mm, such as at least 20 mm.

According to an advantageous embodiment of the invention, said minimum air distance is at least 10 cm, preferably at least 15 cm, more preferably at least 20 cm, even more preferably at least 24 cm, most preferably at least 28 cm, such as at least 32 cm, such as at least 36 cm.

According to an advantageous embodiment of the invention, said insulating arrangement is supported by and fixated to a maintaining surface, e.g. a surface of a wind turbine blade, wherein said minimum surface distance is substantially parallel to said maintaining surface.

One advantage of the above embodiment may be that the distance between the down conductor and the surface of the wind turbine blade may often be reduced. Especially, when said sensor arrangement comprises a coil which the down conductor is fed through in order to permit measurements on the down conductor, the coil may often need to be some distance, e.g. the minimum insulation distance, from the maintaining surface to establish an effective minimum surface distance. However, by keeping the minimum surface distance and the maintaining surface substantially parallel, the down conductor can be kept relatively close to the maintaining surface, such as within a distance corresponding to twice or three times the minimum insulation distance. By decreasing the distance between the down conductor and the blade surface, a more robust and long-term stable arrangement may be achieved. Since bending the down conductor may lead to a vulnerable point on the down conductor, a considerable advantage may be achieved by having the down conductor in abutment or at least very near to the inner blade surface and, thereby, minimizing the amount of bending of the down conductor.

In certain example embodiments, the maintaining surface may be an inner or an outer surface of a wind turbine blade, preferable near the blade root. However, in alternative example embodiments, the maintaining surface may be an outer surface of a wind turbine hub, or another inner or outer surface of the wind turbine.

In various example embodiments, substantially parallel may be understood as not deviating more than 25° from parallel, such as not deviating more than 20° from parallel, such as not deviating more than 15° from parallel, such as not deviating more than 10° from parallel, such as not deviating more than 5° from parallel.

According to an advantageous embodiment of the invention, the distance between the part of said connection arrangement enclosed in said insulating arrangement and said maintaining surface is between 5 mm and 20 cm, preferably between 5 mm and 15 cm, more preferably between 5 mm and 10 cm, most preferably between 5 mm and 5 cm.

An advantage of the above embodiment may be that it is possible to keep all part of the sensor arrangement and the insulating arrangement relatively close to the maintaining surface. Thereby, the lifetime of the lightning measuring system may be increased, e.g. due to less risk of maintenance staff damaging the sensor arrangement and/or the insulating arrangement.

According to an advantageous embodiment of the invention, said lightning measuring system comprises a mounting arrangement formed substantially by said insulating arrangement.

One advantage of the above embodiment may be that the down conductor may be kept relatively close to said maintaining surface. This may, in turn, limit the mechanical stress and hence increase the mechanical durability of the down conductor. Since he mounting arrangement is made up by said insulating arrangement, the connection arrangement and/or the down conductor, whichever is at least partly enclosed by said insulating arrangement, may be maintained relatively close to said maintaining surface. Also, since the insulating arrangement encloses the sensor arrangement, it may also be possible to position the sensor arrangement in close proximity from said maintaining surface. Since the sensor arrangement, depending on the embodiment, will have to be positioned in a certain way relative to the down conductor, and often rather close to the down conductor, e.g. enclosing the down conductor, an arrangement where the sensor arrangement could not be positioned close to the maintaining surface would often lead to said down conductor having to be similar removed from the maintaining surface, at least at the position of the sensor arrangement, which again may lead to the down conductor being substantially non-straight, which may, at least in some embodiments, be a substantial disadvantage. The above embodiment and advantages may be especially pronounced when said minimum surface distance is substantially parallel to a maintaining surface, e.g. a surface of said wind turbine blade.

I.e. the insulating arrangement facilitates not only insulation between the down conductor on one side and the sensor arrangement or the connection arrangement on the other hand, but also the mounting arrangement for mounting and fixating the insulating arrangement to the maintaining surface. Finally, the insulating arrangement facilitates protection of said sensor arrangement and a part of the connection arrangement against external impact, such as vibrations in an operating wind turbine and impact shocks inflicted of e.g. maintenance staff, e.g. when walking or moving on or near the insulating arrangement.

According to an embodiment of the invention, said lightning measuring system comprises a mounting arrangement formed at least partly by said insulating arrangement.

According to an advantageous embodiment of the invention, said insulating arrangement is made of an insulating material chosen from the list comprising thermoset polymers, thermoplastic polymers, composite materials, or any combination thereof.

According to alternative embodiments the insulating arrangement may comprise other insulating materials or compounds. Such other insulating materials may comprise ceramic materials, porcelain, glass, plastics, polymeric materials, rubbers or combinations thereof. In some embodiments, it may be advantageous to form combinations of different insulating materials as composite materials; in other embodiments, however, the insulating arrangement may be formed by several insulating parts, the insulating part being formed by different insulating materials. In an example embodiment, the insulating arrangement may e.g. comprise several insulating discs formed by glass or porcelain, connected by a plastic or rubber material.

According to a advantageous embodiment of the invention, said insulating arrangement is made of an insulating material, said insulating material has a resistivity of at least $10^9$ $\Omega \cdot m$, such as at least $10^{10}$ $\Omega \cdot m$, such as at least $10^{11}$ $\Omega \cdot m$, such as at least $10^{12}$ $\Omega \cdot m$, such as at least $10^{13}$ $\Omega \cdot m$.

One advantage of the above embodiment may be that insulating materials having a relatively high resistivity typically also exhibit relatively high breakdown field strengths, and therefore are relatively resistant to insulation breakdown and/or surface flashover.

According to an advantageous embodiment of the invention, said insulating arrangement is made of an insulating material, said insulating material exhibiting insulation breakdown field strength of at least 5 kV/mm, preferably at least 8 kV/mm, more preferably at least 10 kV/mm, most preferably at least 15 kV/mm or at least 20 kV/mm.

One advantage of using insulating materials having relatively high insulation breakdown field strength may be that the minimum insulation distance may be kept shorter, i.e. less material has to be used.

In certain example embodiments, the insulation breakdown field strength may even be at least 30 kV/mm, at least 35 kV/mm, or at least 40 kV/mm. However, in certain other alternative embodiment, materials with relatively insulation breakdown field strengths, such as e.g. 2 kV/mm, may be used.

According to an advantageous embodiment of the invention, said insulating arrangement is made of an insulating material, said insulating material is effective to prevent surface flashover of voltages up to at least 100 V/mm, preferably at least 125 V/mm, more preferably at least 150 V/mm, most preferably at least 175 V/mm or at least 200 V/mm.

One advantage of using insulating materials where relatively high electrical field strengths are needed to invoke surface flashover may be that the minimum surface distance may be kept shorter, i.e. less material has to be used.

According to an embodiment of the invention, said insulating arrangement is made of an insulating material, said insulating material has a relatively high mechanical strength.

According to an advantageous embodiment of the invention, said insulating arrangement is adapted to withstand vibrations having vibrational frequencies at least within the range of 100-400 Hz, preferably 10-500 Hz, more preferably 5-800 Hz, the vibrations having maximum accelerations of up to at least 4 g, preferably at least 6 g, more preferably at least 7 g.

According to some embodiments, it may be advantageous to use insulating arrangements adapted to withstand vibrations having vibrational frequencies even lower that in the above embodiment, such as down to 1 Hz, 0.5 Hz or even 0.25 Hz.

According to an advantageous embodiment of the invention, said connection arrangement comprise a further connection arrangement insulation, such as an inner connection arrangement insulation.

According to an embodiment of the invention, said inner connection arrangement insulation may preferably be understood as an insulation positioned below said insulating arrangement.

According to an advantageous embodiment of the invention, said further connection arrangement insulation stretches substantially from said sensor arrangement to said data collection unit.

According to an embodiment of the invention, said further insulation stretching substantially from said sensor arrangement to said data collection unit may cover at least 90% of the distance between said sensor arrangement and said data collection unit, such as at least 95%.

According to an advantageous embodiment of the invention, said insulating arrangement and said further connection arrangement insulation are made of different insulating materials.

According to an advantageous embodiment of the invention, said sensor arrangement, such as said Rogowski coil, comprise a further sensor insulation, such as an inner sensor insulation.

According to an advantageous embodiment of the invention, said insulating arrangement and said further sensor insulation are made of different insulating materials.

According to an embodiment of the invention, said down conductor may comprise a further insulation.

According to an advantageous embodiment of the invention, the lighting measuring system is adapted to measure within a frequency band from 100 mHz to 5 MHz, preferably from 10 mHz to 8 MHz, most preferably from 1 mHz to 10 MHz.

One advantage of the above embodiment may be that the lightning measuring system is adapted to measure and resolve changes in the lightning current in the down conductor with relatively high precision without compromising the lightning measuring system to flashovers and/or insulation breakdown.

According to an advantageous embodiment of the invention, said down conductor is fixated to a maintaining surface, such as an inner surface of a wind turbine blade by means of said sensor arrangement.

According to an advantageous embodiment of the invention, said fixation is effective under operation of said wind turbine.

It should be understood that e.g. vibration in an operating wind turbine may be relatively significant and that some systems may work only when tested in controlled laboratory conditions. However, by means of the insulating arrangement, the sensor arrangement is kept stabilized.

According to an advantageous embodiment of the invention, said down conductor is fixated to said maintaining surface, such as an inner surface of a wind turbine blade, along a substantial part of the length of said down conductor along the maintaining surface, such as at least 50% of the length of said down conductor along the maintaining surface, preferably at least 60%, more preferably at least 70%, even more preferably at least 80%, most preferably at least 90%.

One advantage of the above embodiment may be that the down conductor may be kept fixated to the maintaining surface even at the position of the sensor arrangement. Since the sensor arrangement, especially Rogowski coils, typically needs to enclosed or encircle the down conductor, and the insulating arrangement consequently also need to do the same, the down conductor have to be removed from the maintaining surface at the position of the sensor arrangement. Such a non-fixated down conductor or part of a down conductor may be a significant disadvantage, e.g. due to the strong electrodynamical forces and hence a limited durability in the harsh environment of an operating wind turbine. Therefore, the down conductor is typically kept fixated along the longest possible distance to the maintaining surface. However, when releasing the down conductor at the position of the sensor arrangement, the portion of the down conductor may be relatively weak. But fixating the down conductor by the sensor arrangement and the insulating arrangement in which it is enclosed, an advantageous embodiment is obtained.

According to an advantageous embodiment of the invention, said insulating arrangement defines and fixates the position of said sensor arrangement relative to said down conductor.

One advantage of the above embodiment may be that the measurement by the sensor arrangement on lightning currents in the down conductor may be performed with improved accuracy and precision. Typically, a change in the position of the sensor arrangement relative to the down conductor may cause a measurement to change, leading to a decrease in precision. Also, if the down conductor is not positioned where it is expected to be, relative to the sensor arrangement, inaccuracies may arise. Therefore, by defining and fixating the position of the down conductor relative to the sensor arrangement, improved accuracy and precision may be obtained. The above embodiment may especially be an advantage when said sensor arrangement comprises a Rogowski coil. Even if many Rogowski coils are relatively precise and accurate regardless of the relative position of the down conductor and the Rogowski coil, a change in the relative position may often cause a deviation up to 1 or 2% in the performed measurement.

According to an advantageous embodiment of the invention, the position of said down conductor relative to said sensor arrangement is fixated with a precision of at least 20 mm, such as at least 10 mm, such as at least 5 mm, such as at least 2 mm.

I.e. according to the above embodiment, the position of the down conductor relative to the sensor arrangement can vary not more than 20 mm, such as no more than 10 mm, such as no more than 5 mm, such as no more than 2 mm. However, in some embodiments the position of the down conductor may be fixated to vary no more than 1 mm, or even 0.1 mm, e.g. by gluing said down conductor to said insulating arrangement or by said down conductor being cast into said insulating arrangement.

According to an advantageous embodiment of the invention, the position of said down conductor relative to said sensor arrangement is fixated during operation of said wind turbine.

One advantage of the above embodiment may be that the fixation of the down conductor relative to the sensor arrangement is stable and can withstand the harsh environment of an operating wind turbine, such as e.g. vibrations etc.

According to an advantageous embodiment of the invention, said sensor arrangement is adapted to generate an electrical signal based on an electric parameter, such as a change of current, in the down conductor.

Such generated electrical signal may e.g. be proportional to, or at least monotonically increasing as a function of, the electric parameter, such as the change of current, in the down conductor. Therefore, by knowing the response of the sensor arrangement for different down conductor currents or change of currents, the actual current or change of current may be established. One example of the above embodiment may be using a sensor, such as a Rogowski coil, which generates an electric signal being a voltage based on a change of the magnetic field, the magnetic field in turn being based on an electric parameter in the down conductor, namely the current in the down conductor. In other examples the electric parameter may e.g. be an electric current, and the electric parameter in the down conductor may be e.g. the current in down conductor.

According to an advantageous embodiment of the invention, said sensor arrangement comprises a coil, said coil being adapted to generate an electrical signal based on an electric parameter, such as a change of current, in the down conductor.

According to an advantageous embodiment of the invention, said coil is a Rogowski coil.

An advantage of the above embodiment may be that Rogowski coils are relatively accurate and have a relatively high bandwidth due to a core substantially of air and/or dielectric material. However, even though a Rogowski coil does not need to be in direct physical contact with the down conductor, flashover and/or insulation breakdown between the down conductor and the Rogowski coil may still take place. However, by of the insulating arrangement according to the invention, the Rogowski coil, and elements electrically connected thereto, such as the data collection unit, may be protected against lightning currents in the down conductor.

According to an advantageous embodiment of the invention, said Rogowski coil comprises
 a number of coil windings, and
 a returning loop inside said coil windings.

According to an advantageous embodiment of the invention, said Rogowski coil has a core, substantially free of magnetisable material, apart from said returning loop.

According to an example embodiment, the core of the Rogowski coil may be an air core, a dielectric core comprising one or more dielectric materials, or a combination thereof.

According to an advantageous embodiment of the invention, said Rogowski coil comprises
 a winding part, and
 a returning loop,
 said winding part comprising a plurality of subsequently electrically connected windings, e.g. forming a circular or semi-circular shape,
 said returning loop being connected to one end of said winding part and returning towards the opposite end of said winding part inside substantially all of the windings of said winding part.

According to an example embodiment, said winding part forms a circular or semi-circular toroid-like shape with circular-shaped windings. However, in an alternative example embodiment, windings forming said winding part may have rectangular shape or other non-circular shape, whereas the overall shape of the Rogowski coil is circular or semi-circular; the toroid may have e.g. circular or rectangular cross-sections. In yet other alternative example embodiments, the overall shape of the Rogowski coil may deviate from circular shape, and may form e.g. rectangular or other shapes. However, according to a preferred embodiment, the overall shape of the Rogowski coil is a toroid shape, i.e. circular or semi-circular, whereas the individual windings may have e.g. circular or rectangular shape.

According to an advantageous embodiment of the invention, said coil, preferably a Rogowski coil, encircles at least 50% of the angular space around the down conductor, such as at least 60%, such as at least 70%, such as at least 80%, such as at least 90%, such as at least 95%, such as at least 98%.

According to an advantageous embodiment of the invention, said coil, preferably a Rogowski coil, encircles at least 99% of the angular space around the down conductor, such as at least 99.5%, such as at least 99.8%, such as at least 99.9%, such as 100.0%.

One advantage of the above embodiment may be an increased accuracy of measurements of lightning current parameters in the down conductor, especially at high frequencies.

According to an advantageous embodiment of the invention, said data collection unit is enclosed in an EMC enclosure.

One advantage of the above embodiment may be that the data collection unit is relatively well protected against the electromagnetic environment outside the EMC enclosure. However, it is important to understand that even a relatively well constructed EMC enclosure may not necessarily provide adequate protection of the data collection unit against the lightning environment, i.e. a lightning measuring system without an insulating arrangement to protect from the voltages associated with the lightning current may not even be expected to survive beyond the first lightning strike.

According to an advantageous embodiment of the invention, said data collection unit comprises
 a measuring and sampling unit for sampling values corresponding an electric parameter, such as a change of current, in the down conductor.
 an analog-to-digital converter,
 a processing unit, and
 a storage unit.

One problem solved in relation to the above embodiment may be that components of the data collection unit may often be relatively fragile, especially to unintended electric discharges. Therefore, there may often be an intrinsic problem associated with using such fragile electronic components to measure on lightning currents that by nature often are unpredictable and involve extreme voltages and currents. However, as set out in previous embodiments of the invention, this problem may be solved as described in the claims. In some embodiments, the data collection unit may also comprise an integrator for integrating the electric signal from the sensor arrangement. Such an integrator may e.g. be installed in or integrated in the measuring and sampling unit.

In various example embodiments, the data collection unit may comprise other components, such as external communication arrangements, e.g. as optical and/or electrical Ethernet interface or USB interface. In various example embodiments, the data collection unit may comprise other components, such as an optical trigger output, or a positioning unit, such as GPS, GLONASS, or other positioning unit. Furthermore, the storage unit may be an on-board storage, such as temporary cache or buffer storage or long term storage, or an external storage, such as a memory card or equivalent. Finally, the data collection unit may comprise further storage units, e.g. one or more of the above exemplified storage units.

According to an advantageous embodiment of the invention, said down conductor is electrically connected in one end to ground, and electrically connected in an opposite end to a wind turbine blade of a wind turbine, preferably to an outer surface of said wind turbine blade, preferably to a part of an outer surface near the tip of the wind turbine blade, e.g. via a lightning receptor.

Typically, a wind turbine may comprise three blades, each of these having a down conductor, the down conductor typically being connected to a part of the surface of the blade, preferably near the tip of the wind turbine blade, typically via a lightning receptor. Thereby, it is intended that if a lightning should strike at the wind turbine, it should strike the part of the surface of the blade to which the down conductor is connected. Thereby, since the down conductor provides electrical connection from the blade tip to the ground, the wind turbine should substantially be unaffected by the lightning strike. However, due to the unpredictable and extreme nature of lightning strikes, the wind turbine is typically not totally unharmed by lightning strikes, and may need maintenance, such as e.g. changing of lightning receptors or the blade tip, after a certain amount of damage is done by one or more lightning strikes. In order to provide surveillance of the wind turbine and estimate the remaining estimated lifetime of different components, or before service is needed, it may typically be advantageous to measure and characterize lightning discharges striking the wind turbine, typically through the blades.

According to an advantageous embodiment of the invention, said wind turbine comprises at least two blades and said lightning measuring system comprises at least two sensor arrangements, each sensor arrangement being connected to a down conductor in each of at least two separate blades, so as to being able to measure lightning currents in said two blades.

According to an advantageous embodiment of the invention, said wind turbine comprises three blades and said lightning measuring system comprises three sensor arrangements, each sensor arrangement being connected to a down conductor in each blade, so as to being able to measure lightning currents in said three blades.

According to an advantageous embodiment of the invention, said sensor arrangement is installed in a wind turbine blade.

According to an example embodiment, said sensor arrangement is installed in a wind turbine blade, on an inner surface of said wind turbine blade or otherwise inside said wind turbine blade, or, alternatively, on an outer surface of said wind turbine blade. The sensor arrangement may be connected to a data collection unit in said wind turbine blade, or alternatively, a data collection unit positioned elsewhere.

According to an advantageous embodiment of the invention, said data collection unit is installed in a wind turbine hub.

According to an example embodiment, said data collection unit is connected to one or more sensor arrangements, preferably positioned in one or more wind turbine blades.

According to an advantageous embodiment of the invention, said data collection unit is installed inside a wind turbine blade.

According to an advantageous embodiment of the invention, said data collection unit is installed in a wind turbine nacelle.

According to an example embodiment said data collection unit is installed in a wind turbine nacelle, inside said wind turbine nacelle, or, alternatively, outside said wind turbine nacelle.

According to an advantageous embodiment of the invention, said sensor arrangement is installed with said down conductor by feeding said down conductor through a through-hole of said sensor arrangement, or by cutting out a part of the down conductor, e.g. approximately 0.5 meter, and installing the remaining two parts of the down conductor on a conductor pre-installed in the sensor arrangement.

According to an advantageous embodiment of the invention, said sensor arrangement encloses a galvanic element constituting a connecting down conductor, which, after installation in a wind turbine, may be connected in each end to two different down conductor, so as to form a single combined down conductor.

According to an advantageous embodiment of the invention, said lightning measuring system is installed in a wind turbine.

One advantage of the above embodiment may be that the condition of the wind turbine may be monitored so as to determine when service is needed and/or certain parts are to be changed.

The invention relates in a second aspect to a wind turbine comprising a lightning measuring system according to any of the preceding embodiments.

One advantage of the above aspect of the invention may be that the condition of the wind turbine may be monitored so as to determine when service is needed and/or certain parts are to be changed.

The invention relates in a third aspect to a wind farm comprising at least one wind turbine, particularly an off-shore wind turbine, said at least one wind turbine comprising a lightning measuring system according to any of the preceding embodiments.

One advantage of the above aspect of the invention may be that the condition of the wind turbine may be monitored so as to determine when service is needed and/or certain parts are to be changed. This may be particularly advantageous for off-shore wind turbines, which are generally not as accessible as land-based wind turbines. Typically, in many embodiments, a wind farm may comprise a plurality of wind turbines.

According to an advantageous embodiment of the invention said wind farm comprises a central data collection system connected to the lightning measuring system of said at least one wind turbine so as to allow said central data collection system to receive data from said lightning measuring system.

The connection and communication between the lightning measuring system and the central data collection system may in an example embodiment be facilitated by SCADA system or another industrial control system, and data from said lightning measuring system may be included in calculation forming the basis of controlling individual wind turbines of the wind farm.

The invention relates in a fourth aspect to a method of installing a lightning measuring system according to any of the preceding embodiments in a wind turbine, said lightning measuring system comprising
  a galvanic element constituting a connecting down conductor installed with the sensor arrangement, the method comprising the steps of
  cutting over said down conductor to form two different down conductors each having a cut-up end formed by the cutting over said down conductor,
  connecting each of said cut-up ends of said two different down conductors to opposing ends of said connecting down conductor so as to form a single combined down conductor.

One advantage of the above aspect of the invention may be that retrofitting to existing wind turbines with down conductors may be relatively simple.

The invention relates in a fifth aspect to a method of installing a lightning measuring system according to any of the preceding embodiments in a wind turbine, the method comprising the steps of
  installing the sensor arrangement and insulating arrangement in the wind turbine,
  feeding said down conductor through a through-hole of said sensor arrangement, and
  connecting the data collection unit with said sensor arrangement using the connection arrangement.

The above aspect of the invention may be especially advantageous when installing a lightning measuring system in a new wind turbine prior to installation of down conductors in the wind turbine.

In the context of the present application, the term "lightning measuring system" is to be understood as a system measuring one or more parameters of a lightning strike by use of a sensor arranged in proximity of a down conductor distributing the lightning current from a structure, such as a wind turbine, and into the ground.

In the context of the present application, the term "data collection unit" should be understood as a unit adapted for collecting data representing an electric signal facilitated to the data collection unit from the sensor arrangement by means of the connection arrangement. A data collection unit may typically comprise a processor for processing collected data, one or more storage unit for temporary and/or long-term storage and suitable computer architecture to facilitate storage and processing of data. Furthermore, the data collection unit may comprise one or more external communication arrangements for communicating data to external receivers and/or receiving requests from external senders etc.

In the context of the present application, the term "down conductor" should be understood as a conductor extending from a point in the wind turbine, such as a lightning receptor or an air termination establishing a lightning strike point, and into the ground so as to facilitate good electrical connection from the wind turbine and to lead any lightning strike current from a lightning strike into the wind turbine and into the ground. Typically, a wind turbine may have intended striking points, such as lightning receptors or air terminations, or areas which it is intended that the lightning will strike. The down conductor then establishes electric connection from the intended striking point for lightning strikes to the ground. In some embodiments the down conductor may be made out of several connected down conductors so as to form a single effective down conductor or down conductor system.

In the context of the present application, the term "sensor arrangement" should be understood as comprising a sensor for measuring one or more electric parameters in the down conductor. In certain embodiments the sensor arrangement may comprise a coil, such as an air-core coil. The sensor arrangement may e.g. be arranged such that a current in the down conductor or a change of current in the down conductor induces an electric signal, e.g. by means of a coil. In some embodiments, a Rogowski coil may be preferred, e.g. due to its broad frequency range, hereunder its ability to measure both relatively high and relatively low frequencies.

In the context of the present application, the term "connection arrangement" should be understood as an arrangement establishing electric contact. The connection arrangement is connected in one end to the sensor arrangement and in an opposite end to the data collection unit. Thereby, the sensor arrangement is put in electric communication with the data collection unit. Typically, the connection arrangement may comprise a cable. E.g. the connection arrangement may establish an electric connection from a first connector of the data collection unit, through the sensor arrangement, and back to a second connector of the data collection unit, so as to allow the data collection unit to measure an electric signal, such as a voltage, induced in the sensor arrangement.

In the context of the present application, the term "insulating arrangement" should be understood as an arrangement enclosing the sensor arrangement and at least a part of said connection arrangement and/or said down conductor. The insulating arrangement is made up from an insulating material, and may in some embodiments be a single element, e.g. a single cast or moulded element. In some other embodiments, the insulating arrangement may comprise different materials. Said insulating arrangement may also comprise composite materials. Preferably, the insulating arrangement consists substantially of one or more insulating materials.

In the context of the present application, the term "minimum insulation distance" should be understood as a distance being the distance in or thickness of the insulating material of the insulating arrangement along a path from the down conductor to the sensor arrangement or the connection arrangement, the path being chosen as the path having the shortest distance through insulating material.

In the context of the present application, the term "minimum surface distance" should be understood as a distance being the surface distance of the insulating arrangement, e.g. between the insulating arrangement and air, along a path from an exposed part of the down conductor to an exposed part of the connection arrangement, the path being chosen as the path having the shortest surface distance along a surface of the insulating arrangement.

In the context of the present application, the term "minimum air distance" should be understood as a distance being the distance through air along a path from an exposed part of the down conductor to an exposed part of the connection arrangement, the path being chosen as the path having the shortest distance through air.

In the context of the present application, the term "exposed part of said connection arrangement" should be understood as the part of the connection arrangement not enclosed in said connection arrangement. Typically, in fact, connection arrangements, such as electrical cables, may include some sort of outer cable insulation. However, with respect to voltages present in the down conductor during lightning strike exposure, such cable insulation may, at least for practical purposes, be disregarded. Therefore, when establishing the minimum insulation distance and especially the minimum surface distance, cable insulation, if any, may be disregarded.

In the context of the present application, the term "exposed part of said down conductor" should be understood as the part of the down conductor not enclosed in said insulating arrangement.

In the context of the present application, the term "insulation breakdown" should be understood as an electrical breakdown or dielectric breakdown that occurs when the electric potential difference between the down conductor and the sensor arrangement exceeds the barrier voltage or breakdown voltage of the insulating arrangement. The result is an electric discharge through the insulating arrangement, which may damage the insulating arrangement, the sensor arrangement, the connection arrangement, and the data collection unit.

In the context of the present application, the term "surface flashover" should be understood as an electric discharge along a surface shortening two potentials completely. Often, this may be along an air-insulator surface, but it may also be along an insulator-insulator interface, or an interface between an insulator and another material, or another interface.

In the context of the present application, the term "air flashover" should be understood as an electric discharge through the air shortening two potentials completely.

In the context of the present application, the term "flashover" refers to surface flashover and air flashover as a collective term.

In the context of the present application, the term "Rogowski coil" should be understood as coil having a number of connected windings together forming a circular, semi-circular, toroid-like shape, or another shape, adapted to surround at least partly, but preferably fully, the down conductor.

In the context of the present application, the term "minimum insulation breakdown voltage" should be understood as the minimum electric potential difference between the down conductor and the sensor arrangement or an enclosed part of the connection arrangement needed to cause an insulation breakdown. Therefore, when the insulating arrangement has a certain minimum insulation breakdown voltage, it will be effective to prevent insulation breakdown for voltages up to this voltage.

In the context of the present application, the term "minimum flashover voltage" should be understood as the minimum electric potential difference between the down conductor and the connection arrangement needed to cause a flashover, i.e. an air flashover or a surface flashover. A separate minimum air flashover voltage and minimum surface flashover may be defined for air flashover and surface flashover, respectively. The minimum flashover voltage is the lowest of the minimum air flashover voltage and the minimum surface flashover.

In the context of the present application, the term "minimum failure voltage" should be understood as the lowest of the minimum surface flashover voltage, minimum air flashover voltage, insulation breakdown voltage, and any voltage needed for flashover and/or insulation breakdown for combination paths along surface(s), through air, and through the insulating arrangement. I.e. when the insulating arrangement is adapted to establish a given minimum failure voltage, the insulating arrangement will prevent flashover, insulation breakdown and any combination thereof for voltages between the down conductor on one hand and the sensor arrangement or connection arrangement on the other hand. In general, relevant voltages, the electric potential difference between the sensor arrangement and the connection arrangement may most often be ignored.

In the context of the present application, the term "lightning current parameters" should be understood as a parameters signifying or characterizing lightning current. Although not limited to these, examples of such lightning current parameters may comprise maximum current rise time for a lightning strike, i.e. maximum dI/dt or continuously the current rise time to establish the maximum value as the maximum current rise time for a lightning strike, the maximum current for a lightning strike, the specific energy for a lightning strike, the total charge for a lightning strike, etc. In some embodiments, the current or change of current in the down conductor is continuously measured so capture a waveform for some or the whole of the lightning strike. Then the parameters may be deducted from the waveform.

In the context of the present application, the term "further insulation" should be understood as different further insulation, e.g. associated with the sensor arrangement, the connection arrangement, the down conductor, or any combination thereof. In some cases the further insulation may be independent from said lightning measuring system, and in any case, the further insulation(s) will be separate from said insulating arrangement.

FIGURES

Figure 1B:
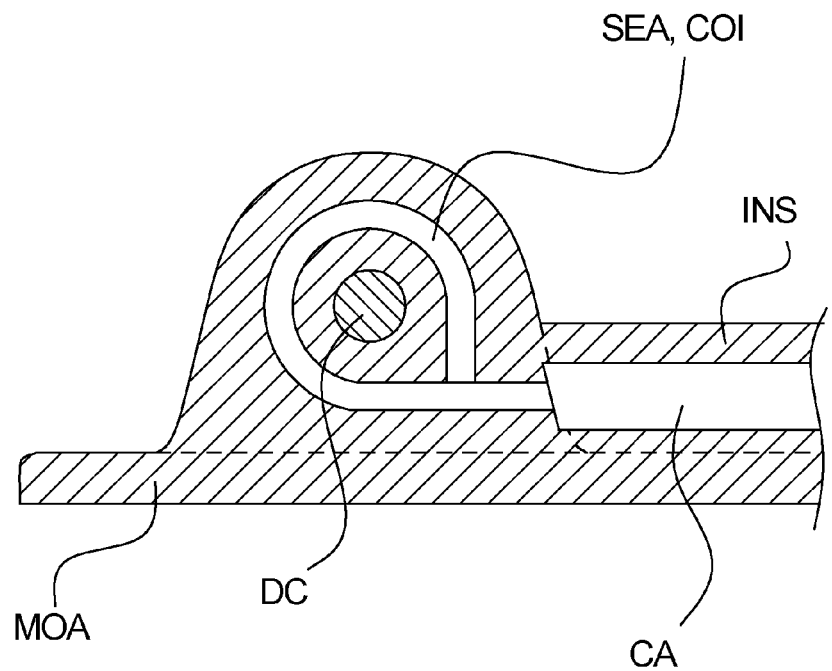
Figure 2A:
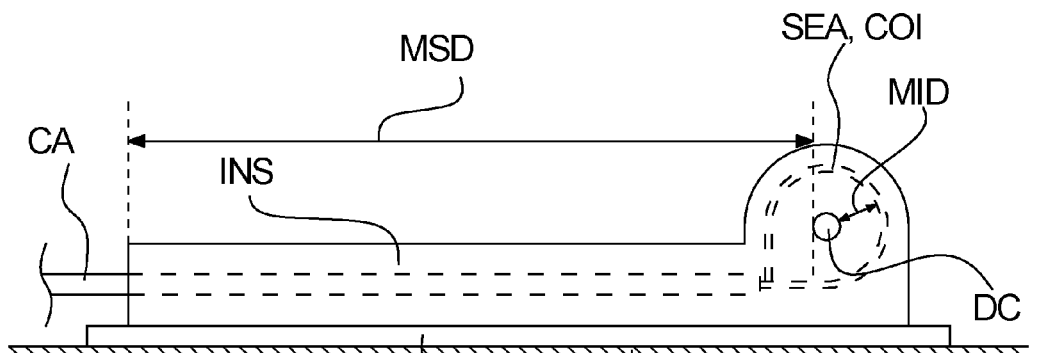
Figure 2B:
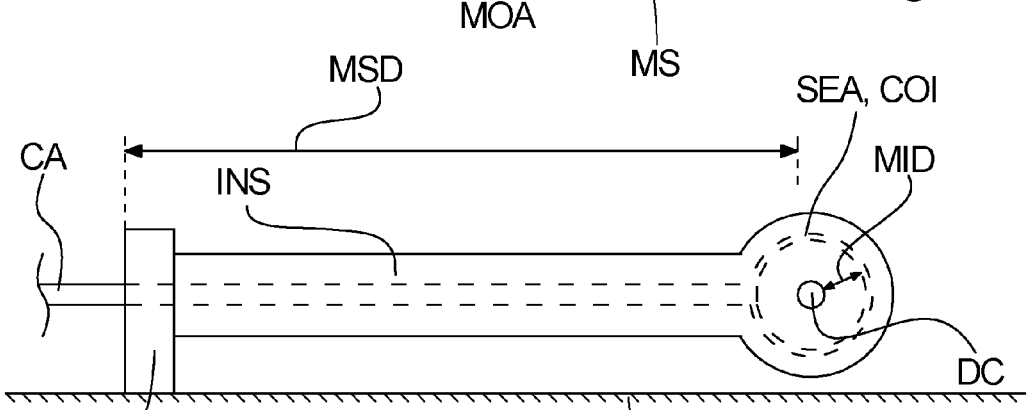
Figure 2C:
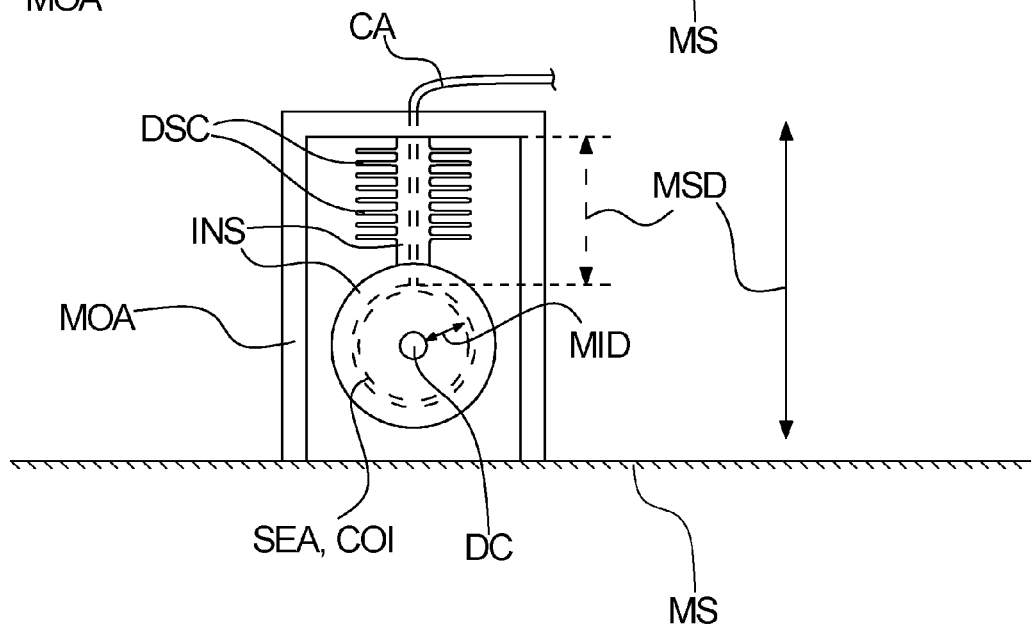
Figure 3A:
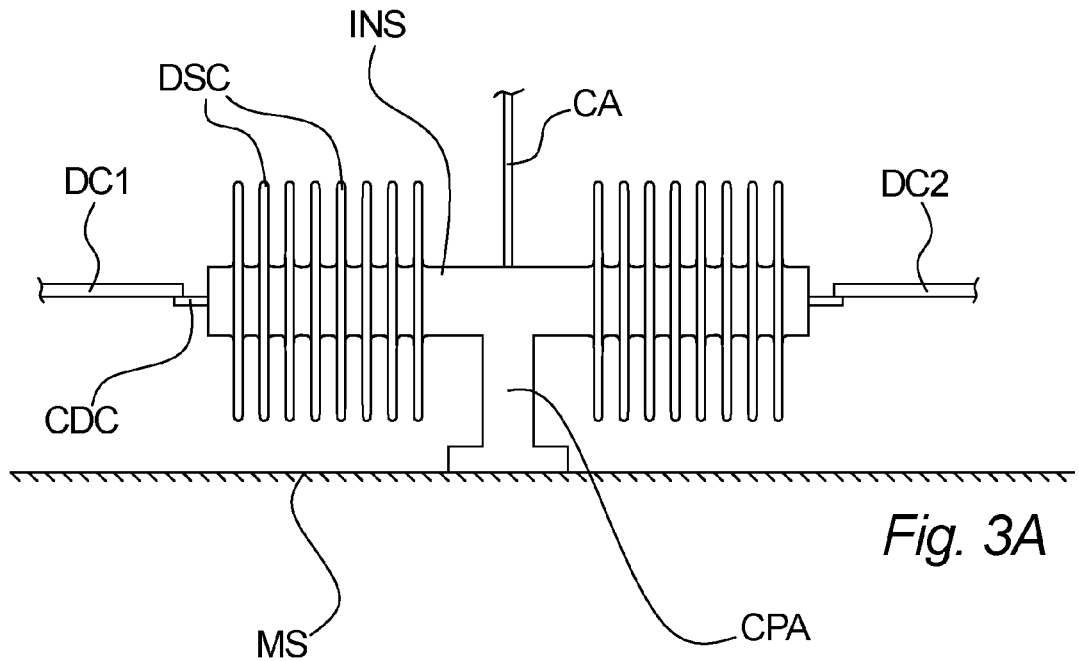
Figure 3B:
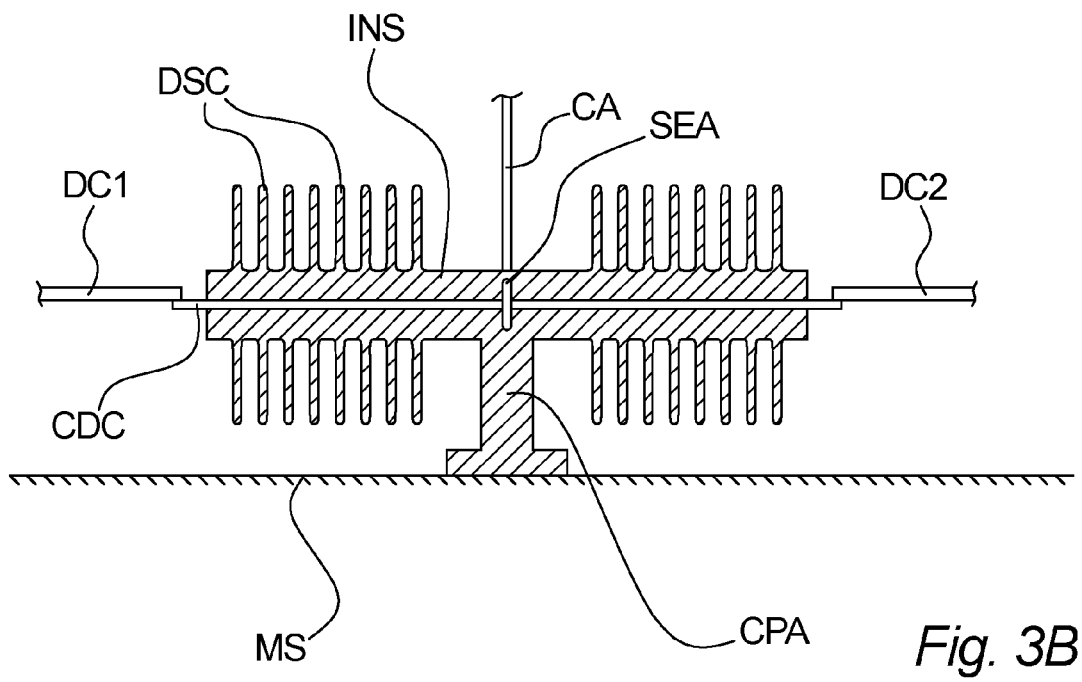
Figure 4A:
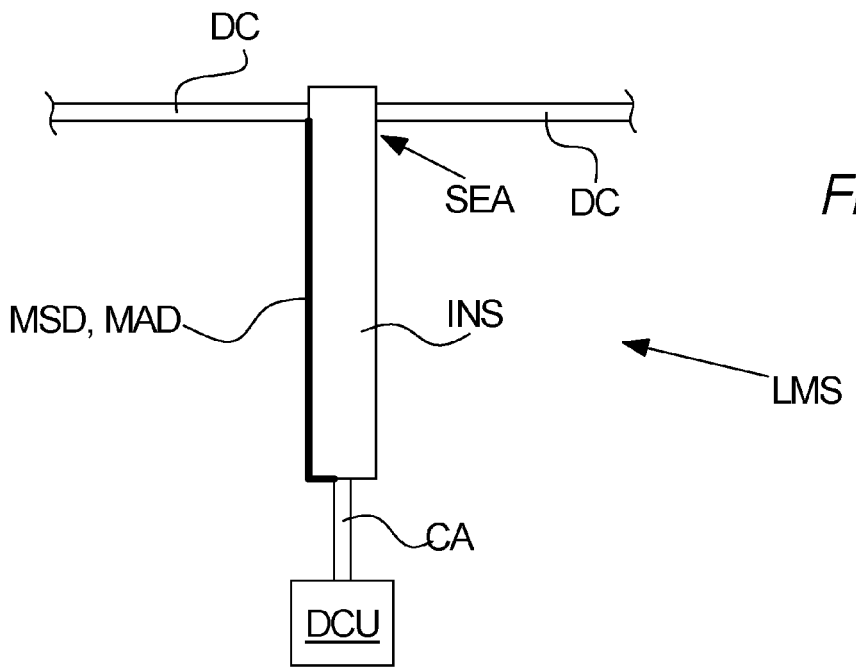
Figure 4B:
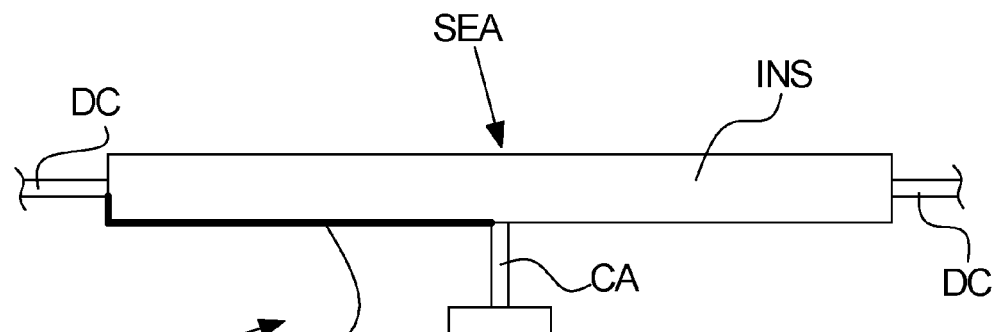
Figure 4C:
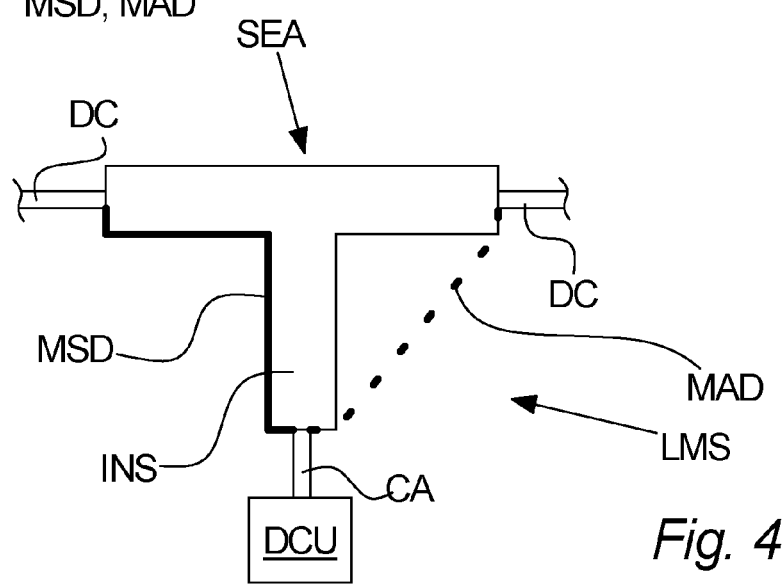
Figure 5A:
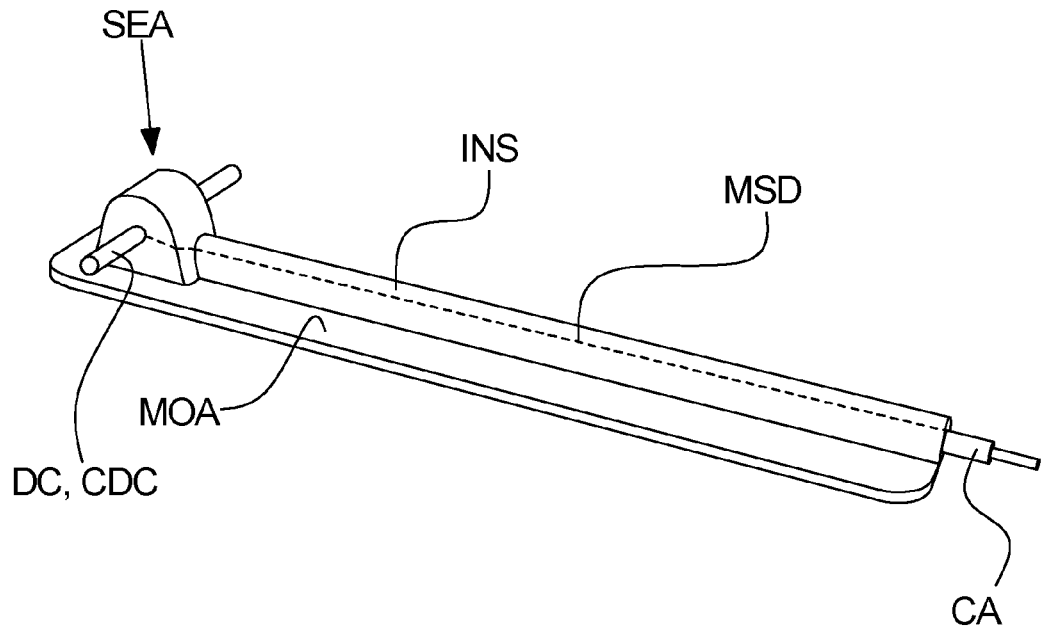
Figure 5B:
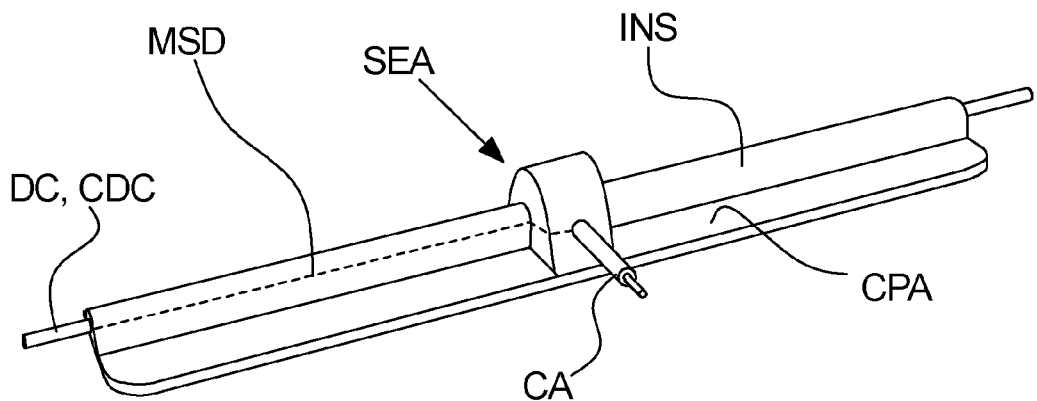
Figure 6A:
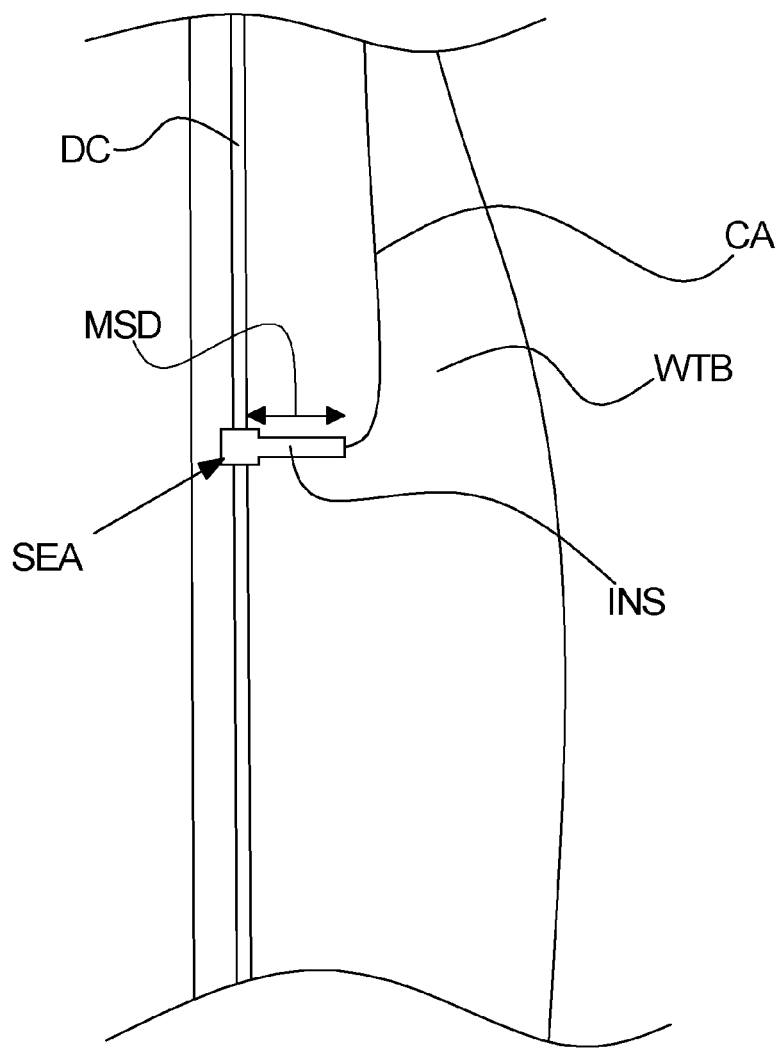
Figure 6B:
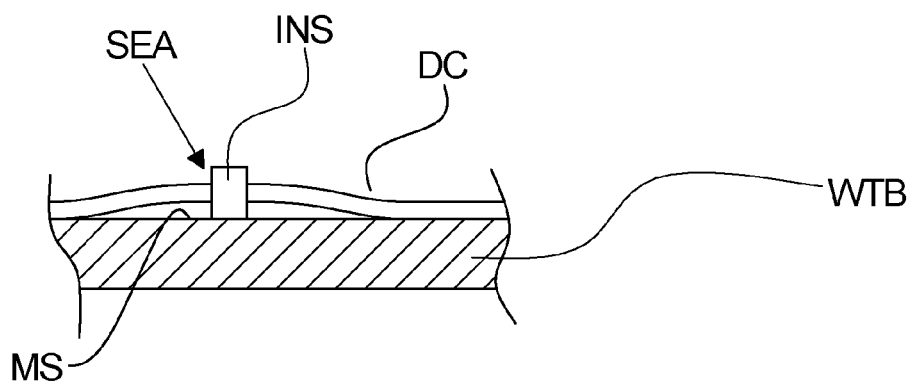
Figure 7:
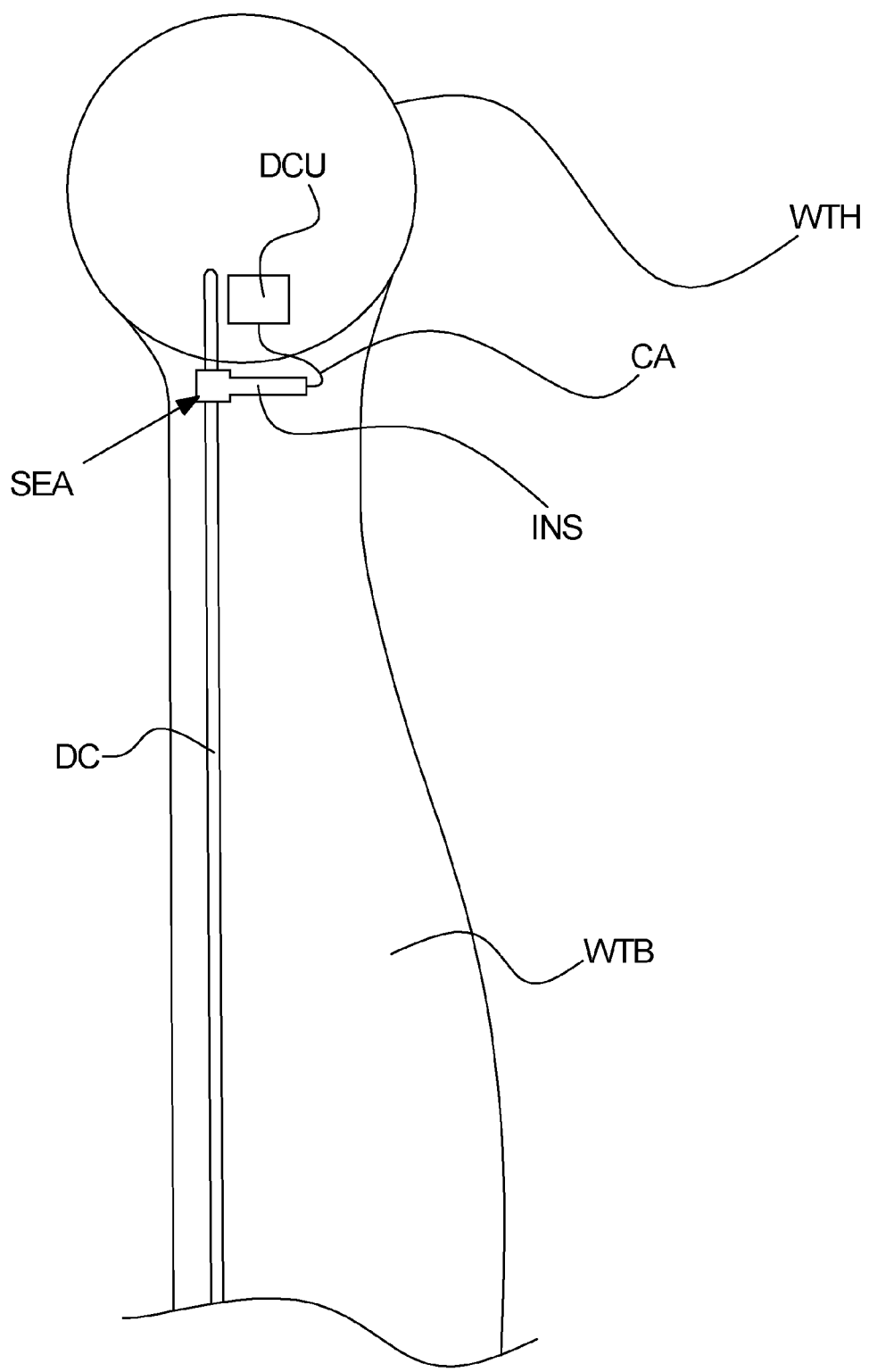
Figure 8:
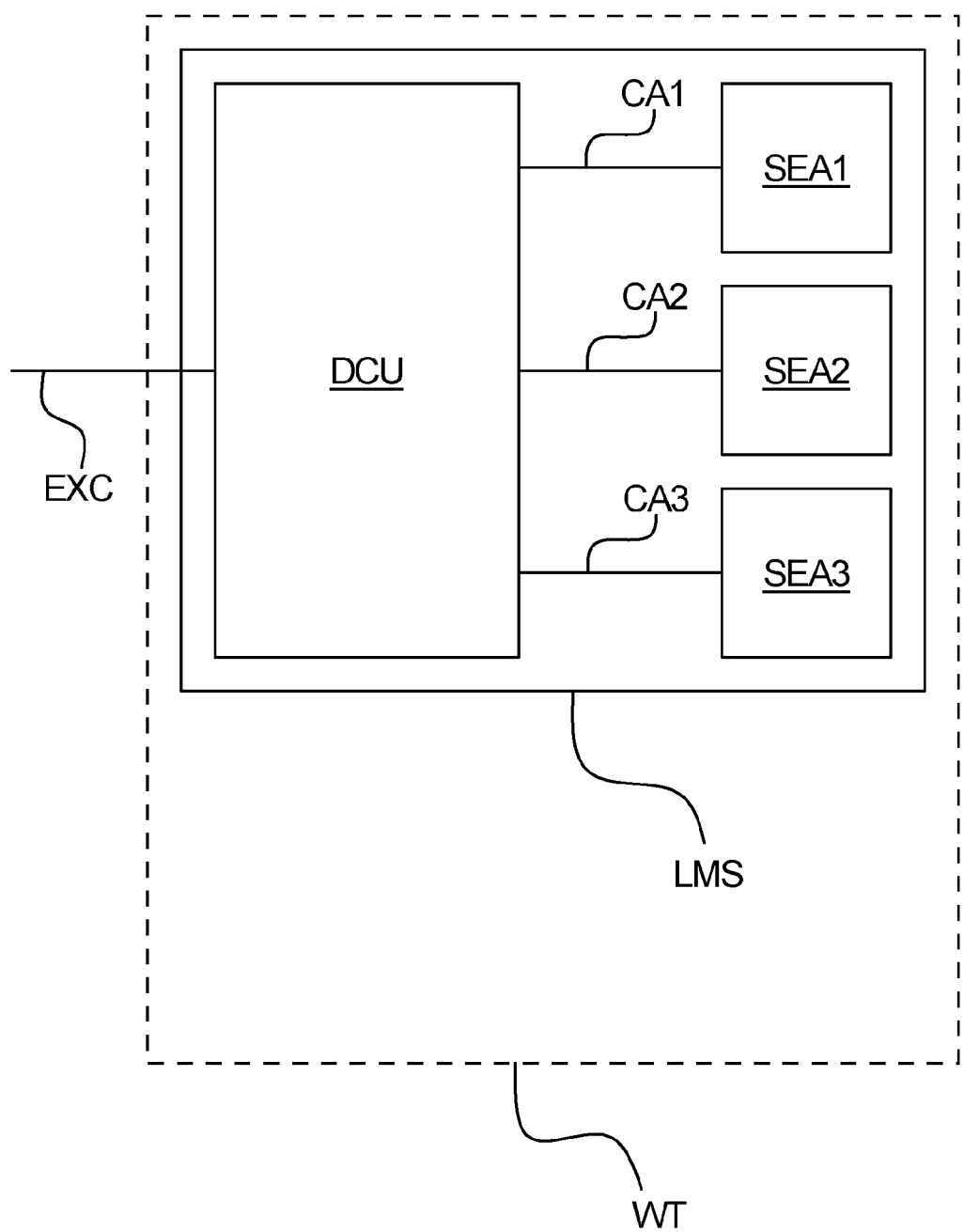
Figure 9:
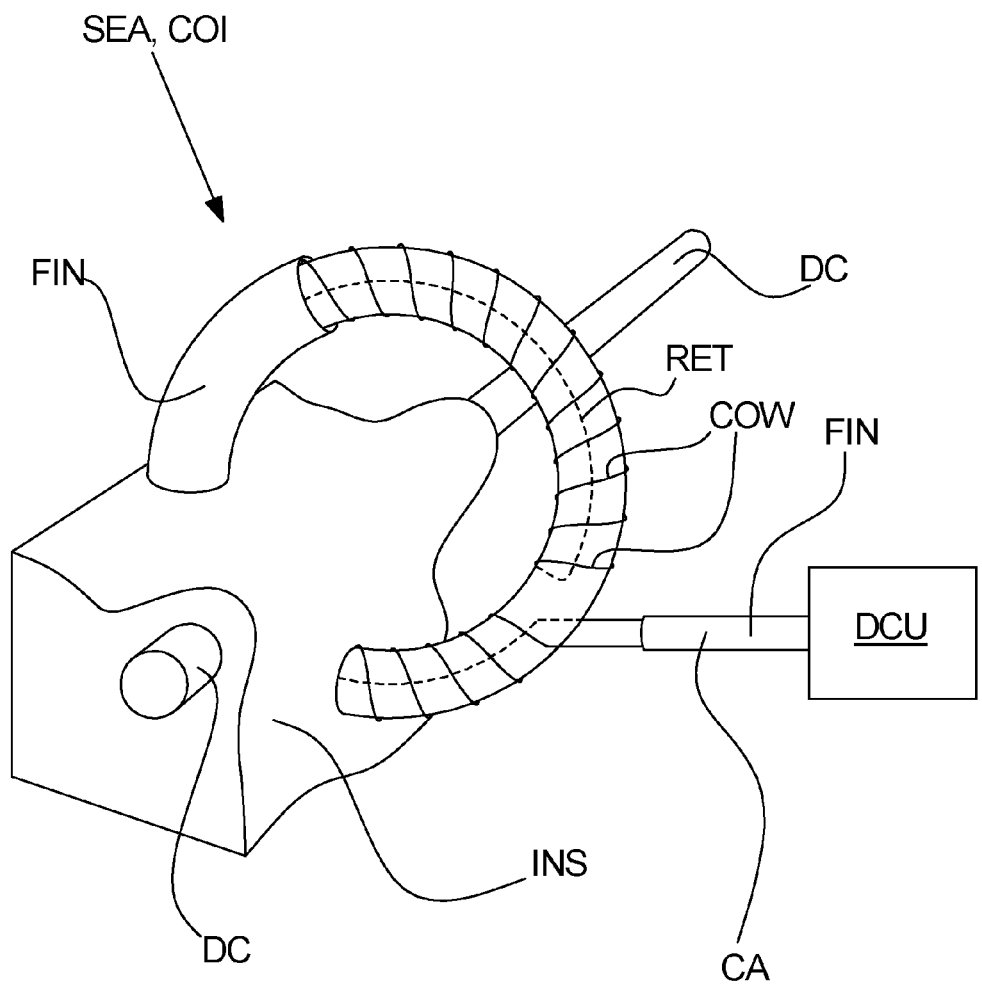

The invention will be described in the following with reference to the figures in which FIG. 1A illustrates a part of a lightning measuring system LMS, FIG. 1B illustrates a part of a lightning measuring system LMS, FIG. 2A illustrates a part of a lightning measuring system LMS, FIG. 2B illustrates a part of a lightning measuring system LMS, FIG. 2C illustrates a part of a lightning measuring system LMS, FIG. 3A illustrates a part of a lightning measuring system LMS, FIG. 3B illustrates a part of a lightning measuring system LMS, FIG. 4A illustrates a lightning measuring system LMS, FIG. 4B illustrates a lightning measuring system LMS, FIG. 4C illustrates a lightning measuring system LMS, FIG. 5A illustrates a part of a lightning measuring system LMS, FIG. 5B illustrates a part of a lightning measuring system LMS, FIG. 6A illustrates a part of a lightning measuring system LMS, FIG. 6B illustrates a part of a lightning measuring system LMS, FIG. 7 illustrates a lightning measuring system LMS, FIG. 8 illustrates a schematic overview of a lightning measuring system LMS, and FIG. 9 illustrates a lightning measuring system LMS,

DETAILED DESCRIPTION

Referring to FIG. 1, a part of a lightning measuring system LMS is illustrated according to an embodiment of the invention. The lightning measuring system LMS comprises a data collection unit DCU (not shown), a sensor arrangement SEA, an insulating arrangement INS, and a connection arrangement CA. The connection arrangement CA, which may typically be an electric cable, connects the sensor arrangement SEA, which may e.g. be a coil COI, such as a Rogowski coil COI, to the data collection unit DCU, so as to establish electric connection. The sensor arrangement SEA is arranged so as to allow measuring electric parameters in a down conductor DC of a wind turbine. As shown this may be done by feeding the down conductor DC through the Rogowski coil COI. Furthermore, as can be seen, the sensor arrangement SEA and part of the connection arrangement CA is enclosed in the insulating arrangement INS, comprising insulating material. The insulating arrangement INS thereby prevents flashovers, such as surface flashovers as well as prevents insulation breakdown, i.e. that the lightning current discharges through the insulating material itself by dielectric breakdown. This is done by establishing a minimum surface distance MSD from an exposed part of the down conductor DC to an exposed part of the connection arrangement CA. Of course many different paths may be defined connecting an exposed part of the down conductor DC with an exposed part of the connection arrangement CA, however, the minimum surface distance MSD is the length of the surface path which has the shortest length, and therefore is most exposed to surface flashover. Similarly, the insulating arrangement INS defines a minimum insulation distance MID, which is the length of the path having the shortest distance through the insulating material. Furthermore, a minimum air distance MAD (not shown) being the shortest distance through air may be defined from an exposed part of the down conductor DC to an exposed part of the connection arrangement CA. As seen on FIG. 1, the insulating arrangement INS comprises a mounting arrangement MOA which facilitates the connection to a maintaining surface MS, which may typically be an inner surface of a wind turbine blade WTB.

Now referring to FIG. 2A-C, three different embodiments of the invention are illustrated. First, the part of a lightning measuring system LMS illustrated on FIG. 2A is similar to that shown in FIG. 1. The insulating arrangement INS forms a mounting arrangement MOA for mounting the insulating arrangement INS to a maintaining surface MS.

On FIG. 2B a part of a lightning measuring system LMS is shown where the lightning measuring system LMS comprises a mounting arrangement MOA, separate from the insulating arrangement INS, the mounting arrangement MOA being substantially orthogonal to the maintaining surface MS rather that parallel as in FIG. 2A. However still both a minimum insulation distance MID and a minimum surface distance MSD are established and the data collection unit DCU is thereby effectively insulated from the down conductor DC. Also, what can be observed in FIGS. 2A and 2B is that by establishing a minimum surface distance MSD which is substantially parallel to the maintaining surface MS, the down conductor DC can be kept in a relatively short distance from the maintaining surface MS. Thereby, the down conductor DC, which is normally kept straight and in contact with the maintaining surface MS, e.g. the inner surface of a wind turbine blade WTB, can be kept relatively close to the straight configuration. Also, what can be seen is that even by establishing a relatively long minimum surface distance MSD, the point on the insulating arrangement INS farthest away from the maintaining surface MS is still relatively close to this maintaining surface MS, compared to the minimum surface distance MSD.

Furthermore, on FIG. 2C is illustrated a part of a lighting measuring system LMS according to a further embodiment of the invention. In this embodiment the minimum surface distance MSD is established partly by means of multiple insulating discs DSC thereby increasing the minimum surface distance MSD considerably compared to the direct straight distance. However, in this embodiment the minimum surface distance MSD is established substantially in a direction orthogonal to the maintaining surface MS, as indicated by the dashed vertical MSD line. As indicated by the solid MSD line, the actual minimum surface distance MSD is, due to the insulating discs DSC, substantially longer than the dashed MSD line, which merely indicates the end points of the minimum surface distance MSD. I.e. the solid MSD line indicates the real minimum surface distance MSD, which bends along the surface of the insulating discs DSC, as a straight line. The lightning measuring system LMS furthermore comprises a mounting arrangement MOA, separate from the insulating arrangement INS, for mounting said insulating arrangement INS to said maintaining surface MS.

It should be emphasized that the minimum surface distances MSD indicated on FIGS. 2A-C are strictly not correct, since the shortest path between the exposed parts of the down conductor DC and the exposed parts of the connection arrangement CA for each of FIGS. 2A-C comprises components that are not parallel to the maintaining surface MS. However, as illustrated on FIGS. 2A-B the minimum surface distances MSD is substantially parallel with the maintaining surface MS, whereas FIG. 2C illustrates a minimum surface distances MSD is substantially orthogonal with the maintaining surface MS.

On FIGS. 3A and 3B a part of a lightning measuring system LSM according to another embodiment of the invention is illustrated. On FIG. 3A a side view is shown, while on FIG. 3B a partly cross-sectional side view of the same is shown. As shown in FIGS. 3A and 3B, the lightning measuring system LMS comprises a sensor arrangement SEA, an insulating arrangement INS, and a connection arrangement CA. The sensor arrangement SEA is connected to the connection arrangement CA in one end. Further to what is shown, the lightning measuring system LMS also comprises a data collection unit DCU connected to the opposite end of the connection arrangement CA. A minimum insulation distance MID (not shown) is established by the insulating material INS, as is a minimum surface distance MSD. The minimum surface distance MSD is extended by the said insulating arrangement INS forming a plurality of insulating discs DSC. Furthermore, the embodiment of FIGS. 3A and 3B illustrates a method of installing a lightning measuring system LMS, and specifically how to install a down conductor DC in the sensor arrangement SEA. As shown, a first down conductor DC1 and a second down conductor DC2 are each connected to opposite ends of a connecting down conductor CDC pre-installed in the insulating arrangement INS thereby forming a single effective down conductor DC establishing electric connection from an intended striking point for lightning strikes to the ground.

Now referring to FIG. 4A-C, lightning measuring systems LMS according to three different embodiments of the invention are illustrated. The lightning measuring system LMS on all FIGS. 4A-C each comprises a data collection unit DCU, a sensor arrangement SEA, an insulating arrangement INS, and a connection arrangement CA. The insulating arrangement INS encloses the sensor arrangement SEA so as to establish a minimum insulation distance MID. Also common to FIGS. 4A-C is that the sensor arrangement SEA is installed to measure on a down conductor DC.

As illustrated on FIG. 4A, the insulating arrangement INS encloses part of the connection arrangement CA to establish a minimum surface distance MSD. On FIG. 4B, the insulating arrangement INS encloses part of the down conductor DC to establish a minimum surface distance MSD. Finally, on FIG. 4C the insulating arrangement INS encloses both part of the down conductor DC as well as part of the connection arrangement CA to establish a minimum surface distance MSD. It should of course be understood in connection with the embodiments of FIGS. 4A-C that he data collection unit DCU may be positioned further away from the sensor arrangement SEA, and that FIGS. 4A-C are only illustrating schematic drawings. On FIG. 4A-C examples of minimum surface distances MSD and minimum air distances MAD is illustrated. On FIG. 4A, it can be seen that the minimum air distance MAD coincides with the minimum surface distance MSD, i.e. the shortest distance in air is the same as the shortest surface distance between said connection arrangement CA and said down conductor DC. Similarly on FIG. 4B, the minimum air distance MAD coincides with the minimum surface distance MSD. However, in FIG. 4C it can be seen that the minimum air distance MAD follows a different path than the minimum surface distance MSD, and that the minimum air distance MAD is shorter than the minimum surface distance MSD. Even though only one minimum surface distance MSD and one minimum air distance MAD is illustrated on FIG. 4A-C, more than one actual path between the exposed parts of the connection arrangement CA and the exposed parts of the down conductor DC may give the same minimum surface distance MSD and one minimum air distance MAD.

Now referring to FIGS. 5A and 5B, a part of a lightning measuring system LMS according to two different embodiments of the invention is illustrated. FIG. 5A illustrates an embodiment similar to that of FIG. 4A. Further to what is shown on FIG. 4A, the insulating arrangement INS shown on FIG. 5A forms part of the mounting surface of the mounting arrangement MOA. Thereby, as seen on FIG. 5A, the down conductor DC may be kept relatively close to a maintaining surface MS, such as an inner surface of a wind turbine blade WTB, on which the insulating arrangement INS is fixated. Furthermore, turning to FIG. 5B, a part of a lightning measuring system LMS similar to that shown on FIG. 4B is illustrated. Further to what is shown on FIG. 4B, the insulating arrangement INS shown on FIG. 5B forms part of the mounting surface of the mounting arrangement MOA. The same may be demonstrated for embodiments similar to that of FIG. 4C. Furthermore, the embodiments on FIGS. 5A and 5B discloses a part of a down conductor DC, such as a connecting down conductor CDC. This connecting down conductor CDC may in one embodiment be pre-fixated in the insulating arrangement INS, and may then later be installed in a wind turbine WT with a down conductor DC. The down conductor DC may then be cut where the sensor arrangement SEA is to be installed, and the end exposed by the cutting may then be fixated to corresponding ends of the connecting down conductor CDC. This embodiment may be particularly advantageous for retrofitting of a lightning measuring system LMS. However, in another embodiment, the insulating arrangement INS may comprise a through-hole for feeding through a down conductor DC so as to allow said sensor arrangement SEA to measure on said down conductor DC. Furthermore, FIGS. 5A-B both illustrate a three-dimensional path giving rise to a minimum surface distance MSD which is substantially parallel to the maintaining surface MS (not shown).

Now referring to FIG. 6A, a part of a lightning measuring system LMS according to an embodiment of the invention is illustrated. The lighting measuring system LMS is shown installed in a wind turbine WT. The sensor arrangement SEA is shown to be arranged in the wind turbine blade WTB. This may preferably be by fixating the insulating arrangement INS to an inner surface of the wind turbine blade WTB. The connection arrangement CA may connect the sensor arrangement SEA, enclosed in the insulating arrangement INS, with a data collection unit DCU (not shown) so as to collect data on lightning current parameters in the down conductor DC. On FIG. 6B, the same is shown in a side view showing the down conductor DC going through the insulating arrangement INS allowing the sensor arrangement SEA to measure on the down conductor DC. Since the insulating arrangement INS of FIG. 6A has a minimum surface distance MSD, which is substantially parallel to the mounting surface MS, i.e. the inner surface of the wind turbine blade WTB, the sensor arrangement SEA may be positioned in relatively close distance from the mounting surface MS, the down conductor DC can likewise be kept relatively close to the mounting surface MS, which may be a significant advantage, e.g. with respect to the down conductor durability and hence lifetime.

On FIG. 7 a lightning measuring system LMS according to an embodiment of the invention is illustrated. The lighting measuring system LMS is shown installed in a wind turbine WT, partly in a wind turbine hub WTH, partly in a wind turbine blade WTB. A data collection unit DCU is positioned in the wind turbine hub WTH, whereas the sensor arrangement SEA is positioned in the root of a wind turbine blade WTB.

Now referring to FIG. 8, a block diagram illustrating a lightning measuring system LMS installed in a wind turbine WT according to an embodiment of the invention. The lightning measuring system LMS comprises a data collection unit DCU, and a first, second, and third sensor arrangement SEA1, SEA2, SEA3. Each sensor arrangement SEA1, SEA2, SEA3 is connected to the data collection unit DCU by a connection arrangement CA1, CA2, CA3. Each of the sensor arrangements SEA1, SEA2, SEA3 are arranged to measure on a down conductor DC of a separate blade of the wind turbine WT. The lightning measuring system LMS may furthermore optionally comprise an external communication arrangement EXC for communicating data, such as raw data, analyzed data, or parameters established based on analyzed data, to an external receiver, such as a SCADA surveillance system or similar. Furthermore, the data collection unit DCU may typically also comprise one or more power supplies, such as a 24 V DC external power supply, a 230 V AC external power supply, or other available voltages.

Referring now to FIG. 9, a lightning measuring system LMS according to an embodiment of the invention is illustrated. The lightning measuring system LMS comprises a data collection unit DCU, sensor arrangement SEA, a connection arrangement CA electrically connecting the data collection unit DCU with the sensor arrangement SEA. The sensor arrangement SEA according to the present embodiment is made up by a Rogowski coil COI. The Rogowski coil COI comprises a plurality of coil windings COW together making up a toroid-shaped helix enclosing a down conductor DC. As seen the lightning measuring system LMS also comprises an insulating arrangement INS, of which only a part is shown for illustrative purposed. As seen the sensor arrangement SEA comprises a further insulation FIN apart of the insulating arrangement INS. Similarly, the connection arrangement CA comprises a further insulation FIN. These further insulations FIN may typically be ignored when establishing the insulating arrangement INS, and exposed part of the down conductor DC or connection arrangement CA is the part of these not covered by the insulating arrangement INS regardless of any further insulation FIN.

FIGURE REFERENCES

CA. Connection arrangement
CAi. i'th connection arrangement
CDC. Connecting down conductor
COI. Coil
COW. Coil winding
DC. Down conductor
DCi. i'th down conductor
DCU. Data collection unit
DSC. Insulating disc
EXC. External communication arrangement
FIN. Further insulation
INS. Insulating arrangement
LMS. Lightning measuring system
MAD. Minimum air distance
MID. Minimum insulation distance
MOA. Mounting arrangement
MSD. Minimum surface distance
RET. Returning loop
SEA. Sensor arrangement
SEAi. i'th sensor arrangement
WTB. Wind turbine blade
WTH. Wind turbine hub

The invention claimed is:

1. A lightning measuring system for measuring lightning current parameters in a down conductor in a wind turbine, said lightning measuring system comprising
    a sensor arrangement being arranged to measure on said down conductor,
    a data collection unit,
    a connection arrangement electrically connecting said sensor arrangement with said data collection unit, and
    an insulating arrangement,
    wherein said sensor arrangement and at least a part of said connection arrangement and/or said down conductor being enclosed in said insulating arrangement thereby defining
        a minimum insulation distance between said sensor arrangement and said down conductor, and
        a minimum surface distance between an exposed part of said down conductor not being enclosed by said insulating arrangement and an exposed part of said connection arrangement not being enclosed by said insulating arrangement,
    for which said insulating arrangement is effective to prevent insulation breakdown between said down conductor and said sensor arrangement and to prevent surface flashover between said exposed part of said down conductor and said exposed part of said connection arrangement, wherein said insulating arrangement is arranged so as to fulfil the condition given by $$\min\left[\sum_{i,j}(D_{mat,i}\cdot E_{mat}+D_{sur,j}\cdot E_{sur})\right]\geq C_{\mathit{eff}}$$

wherein $D_{mat,i}$ represents the i'th distance element through said insulating arrangement, $D_{sur,j}$ represents the j'th distance element on a surface,
wherein $E_{mat}$ represents the electric field needed to cause an insulation breakdown, $E_{sur}$ represents the electric field needed to cause a surface flashover, and
wherein $C_{\mathit{eff}}$ is 50 kV.

2. The lightning measuring system according to claim 1, wherein said insulating arrangement is effective to prevent insulation breakdown between said down conductor and said sensor arrangement and to prevent surface flashover between said exposed part of said down conductor and said exposed part of said connection arrangement for electric potential differences up to a minimum insulation breakdown voltage and/or a minimum flashover voltage,
    said minimum insulation breakdown voltage and/or said minimum flashover voltage being 50 kV.

3. The lightning measuring system according to claim 1, wherein said insulating arrangement is arranged so as to fulfil the condition given by $$\min\left[\sum_{i,j,k}(D_{mat,i}\cdot E_{mat}+D_{sur,j}\cdot E_{sur}+D_{air,k}\cdot E_{air})\right]\geq C_{\mathit{eff}}$$

wherein $D_{mat,i}$ represents the i'th distance element through said insulating arrangement, $D_{sur,j}$ represents the j'th distance element on a surface, $D_{air,k}$ represents the k'th distance element through air, wherein $E_{mat}$ represents the electric field needed to cause an insulation breakdown, $E_{sur}$ represents the electric field needed to cause a surface flashover, $E_{air}$ represents the electric field needed to cause an air flashover, and
wherein $C_{\mathit{eff}}$ is 50 kV.

4. The lightning measuring system according to claim 1, wherein said minimum insulation distance is effective to prevent insulation breakdown for electric potential differences between said down conductor and said sensor arrangement of up to 50 kV.

5. The lightning measuring system according to claim 1, wherein said minimum surface distance is effective to prevent surface flashover for electric potential differences between said down conductor and said sensor arrangement of up to at least 50 kV.

6. The lightning measuring system according to claim 1, wherein said sensor arrangement and at least a part of said connection arrangement and/or said down conductor being enclosed in said insulating arrangement thereby further defining
    a minimum air distance between an exposed part of said down conductor not being enclosed by said insulating arrangement and an exposed part of said connection arrangement not being enclosed by said insulating arrangement.

7. The lightning measuring system according to claim 1, wherein said minimum air distance is effective to prevent air flashover for electric potential differences between said down conductor and said connection arrangement of up to at least 50 kV.

8. The lightning measuring system according to claim 1, wherein said sensor arrangement comprise a further sensor insulation.

9. The lightning measuring system according to claim 1, wherein said insulating arrangement defines and fixates the position of said sensor arrangement relative to said down conductor.

10. The lightning measuring system according to claim 9, wherein the position of said down conductor relative to said sensor arrangement is fixated with a precision of at least 20 mm.

11. The lightning measuring system according to claim 9, wherein the position of said down conductor relative to said sensor arrangement is fixated during operation of said wind turbine.

12. The lightning measuring system according to claim 1, wherein said data collection unit comprises
    a measuring and sampling unit for sampling values corresponding an electric parameter in the down conductor (DC),
    an analog-to-digital converter,
    a processing unit, and
    a storage unit.

13. The lightning measuring system according to claim 1, wherein said down conductor is electrically connected in one end to ground, and electrically connected in an opposite end to a wind turbine blade of a wind turbine.

14. The lightning measuring system according to claim 13, wherein said wind turbine comprises at least two blades and said lightning measuring system comprises at least two sensor arrangements, each sensor arrangement being connected to a down conductor in each of at least two separate blades, so as to being able to measure lightning currents in said two blades.

15. The lightning measuring system according to claim 1, wherein said sensor arrangement is installed with said down conductor by feeding said down conductor through a through-hole of said sensor arrangement, or by cutting out a part of the down conductor, and installing the remaining two parts of the down conductor on a conductor pre-installed in the sensor arrangement.

16. The lightning measuring system according to claim 1, wherein said lightning measuring system is installed in a wind turbine.

17. A wind turbine comprising the lightning measuring system according to claim 1.

18. A method of installing the lightning measuring system according to claim 1 in a wind turbine, the method comprising the steps of
   installing the sensor arrangement and insulating arrangement in the wind turbine,
   feeding said down conductor through a through-hole of said sensor arrangement, and
   connecting the data collection unit with said sensor arrangement using the connection arrangement.

19. A lightning measuring system for measuring lightning current parameters in a down conductor in a wind turbine, said lightning measuring system comprising
   a sensor arrangement being arranged to measure on said down conductor,
   a data collection unit,
   a connection arrangement electrically connecting said sensor arrangement with said data collection unit, and
   an insulating arrangement,
   wherein said sensor arrangement and at least a part of said connection arrangement and/or said down conductor being enclosed in said insulating arrangement thereby defining
   a minimum insulation distance between said sensor arrangement and said down conductor, and
   a minimum surface distance between an exposed part of said down conductor not being enclosed by said insulating arrangement and an exposed part of said connection arrangement not being enclosed by said insulating arrangement,
   for which said insulating arrangement is effective to prevent insulation breakdown between said down conductor and said sensor arrangement and to prevent surface flashover between said exposed part of said down conductor and said exposed part of said connection arrangement, wherein said insulating arrangement is arranged so as to fulfil the condition given by $$\min\left[\sum_{i,j,k}(D_{mat,i}\cdot E_{mat}+D_{sur,j}\cdot E_{sur}+D_{air,k}\cdot E_{air})\right]\geq C_{\textit{eff}}$$

wherein $D_{mat,i}$ represents the i'th distance element through said insulating arrangement, $D_{sur,j}$ represents the j'th distance element on a surface, $D_{air,k}$ represents the k'th distance element through air, wherein $E_{mat}$ represents the electric field needed to cause an insulation breakdown, $E_{sur}$ represents the electric field needed to cause a surface flashover, $E_{air}$ represents the electric field needed to cause an air flashover, and wherein $C_{\textit{eff}}$ is 50 kV.

* * * * *